(12) United States Patent
Dodelet et al.

(10) Patent No.: US 7,056,479 B2
(45) Date of Patent: Jun. 6, 2006

(54) PROCESS FOR PREPARING CARBON NANOTUBES

(75) Inventors: Jean-Pol Dodelet, Ste-Julie (CA);
Barry Stansfield, Ste-Bruno (CA);
Oliver Smiljanic, Montreal (CA);
Tarik Dellero, Montreal (CA); Sylvain Desilets, St-Augustin (CA)

(73) Assignee: Her Majesty the Queen in right of Canada, as represented by the Minister of National Defence, Ottawa (CA)

( * ) Notice: Subject to any disclaimer, the term of this patent is extended or adjusted under 35 U.S.C. 154(b) by 527 days.

(21) Appl. No.: 10/275,435

(22) PCT Filed: May 10, 2001

(86) PCT No.: PCT/CA01/00658

§ 371 (c)(1),
(2), (4) Date: Nov. 6, 2002

(87) PCT Pub. No.: WO01/85612

PCT Pub. Date: Nov. 15, 2001

(65) Prior Publication Data

US 2003/0111334 A1 Jun. 19, 2003

Related U.S. Application Data

(60) Provisional application No. 60/203,398, filed on May 11, 2000.

(51) Int. Cl.
*B01J 19/08* (2006.01)
*C23C 16/26* (2006.01)
*D01F 19/127* (2006.01)

(52) U.S. Cl. .................. 422/186; 423/447.3; 427/592; 427/593; 118/724

(58) Field of Classification Search ................ 422/186; 423/447.3; 427/592, 593; 118/724
See application file for complete search history.

(56) References Cited

U.S. PATENT DOCUMENTS 5,105,123 A * 4/1992 Ballou .................... 315/111.21
6,887,451 B1 * 5/2005 Dodelet et al. .......... 423/447.3

* cited by examiner

*Primary Examiner*—Kishor Mayekar
(74) *Attorney, Agent, or Firm*—George A. Seaby

(57) ABSTRACT

Carbon nanotubes are formed on carbon paper by first depositing a metal catalyst on the carbon paper, and passing a feedstock gas containing a source of carbon over the substrate while applying an electrical current thereto to heat the substrate sufficiently to generate a reaction between the catalyst and the feedstock gas. Alternatively, inert gas under pressure is passed through a tubular metal cathode while passing an electric current through the cathode to produce a plasma of fine catalyst particles which are deposited on a porous carbon substrate, and a feedstock gas containing a source of carbon is passed over the substrate to cause a reaction between the catalyst and the carbon source resulting in the formation of carbon nanotubes.

18 Claims, 6 Drawing Sheets

Ar + H₂ + Hydrocarbon

PROCESS FOR PREPARING CARBON NANOTUBES

This application claims the benefit of Provisional Application No. 60/203,398, filed May 11, 2000.

This invention relates to a process and apparatus for producing carbon nanotubes and nanofibers During the past eight years carbon nanotubes have generated a substantial amount of interest in the scientific community. The high chemical stability, mechanical strength and electrical conductivity of single walled (SWCNT) and multiwalled carbon nanotubes (MWCNTs) make the material attractive for industrial applications such as microelectronics, the strengthening of composite materials and hydrogen storage.

At present, carbon nanotubes are produced by laser ablation, ablation using an electric arc and carbon vapor deposition. Examples of these method are described in American Scientist 85 (1997) 324–337; Journal of Molecular Catalysts A: Chemical 116 (1997) 397–403; Nature 354 (1991) 56; Nature 358 (1992) 220; Nature 363 (1993) 603; Chemical Phys. Lett. 289 (1998) 602; Appl. Phys. Left 75 (1999) 367; Carbon 35 (1997) 1495; Published International Patent Applications WO 99/06618, Feb. 11, 1999 and WO 99/25652, May 27, 1999 and U.S. Pat. No. 5,780,101, issued Jul. 14, 1998 and U.S. Pat. No. 5,965,267, issued Oct. 12, 1999.

The first two methods, i.e. laser and electric arc ablation are based on the same principle, namely the evaporation of a graphite rod enriched with a metallic catalyst, and condensation of the vapor thus produced in nanotube form. Such methods, which permit the fabrication of bulk multilayer nanotubes, require large amounts of energy for the evaporation process as opposed to the carbon vapor deposition (CVD) method. In fact, in order to achieve atomic vaporization of one mole of carbon, 717 kJ is required, while with the CVD method 227 kJ is generated by the decomposition of one mole of acetylene molecules. With the CVD method, it is possible to control the area where nanotubes are deposited on a surface [J. Am. Chem. Soc. 121(1999) 10832 and Science 282 (1998) 1105]. The problems associated with the CVD method include low yield and the generation of large quantities of amorphous carbon during pyrolysis of the carbon containing gas.

An object of the present invention is to provide a new carbon vapor deposition method which is capable of producing carbon nanotubes in the absence of amorphous carbon at low heating power.

It will be noted that whereas in the process of the present invention only the substrate is heated, in the conventional CVD method the entire reaction vessel is heated.

Another object of the invention is to provide an apparatus for carrying out the above defined process for producing carbon nanotubes.

Accordingly, the present invention relates to a process for producing carbon nanotubes comprising the steps of:
(a) depositing a metallic catalyst on a porous carbon substrate;
(b) passing a feedstock gas containing a source of carbon through the substrate; and
(c) applying an electrical current to said substrate to heat the substrate sufficiently to generate a reaction between said catalyst and said gas, resulting in the formation of carbon nanotubes.

According to another aspect, the invention relates to an apparatus for producing carbon nanotubes comprising:
(a) tube means defining a reaction chamber for receiving a hydrocarbon gas;
(b) spaced apart electrode means in said tube means for retaining said carbon substrate in said container means; and
(c) conductor means for supplying electrical power to said electrode means for heating said carbon substrate by the Joule effect, whereby, when the hydrocarbon gas is introduced into said reaction chamber and the carbon substrate is heated by introducing electrical power thereto, nanotubes are produced on said carbon substrate.

The invention is described below in greater detail with reference to the accompanying drawings, wherein.

EXPERIMENTAL

Method 1

3 ml of a 1.5M aqueous ferrous nitrate solution is added to a solution containing 2 mL of tetraethyl orthosilicate and 2 mL of ethanol. Then 0.5 mL of 10% hydrogen fluoride acid is added to the ferrous nitrate/orthosilicate solution to give a gel containing the ferrous catalyst. A strip of carbon paper is soaked for 2 minutes in the gel. The carbon paper is then blotted and dried for 5 minutes at room temperature. A thin film of silicate containing homogeneously dispersed ferrous nitrate is thus deposited on the carbon paper. Nanoscopic iron catalyst particles produced by this process are now available for the synthesis of nanotubes.

Figure 1:
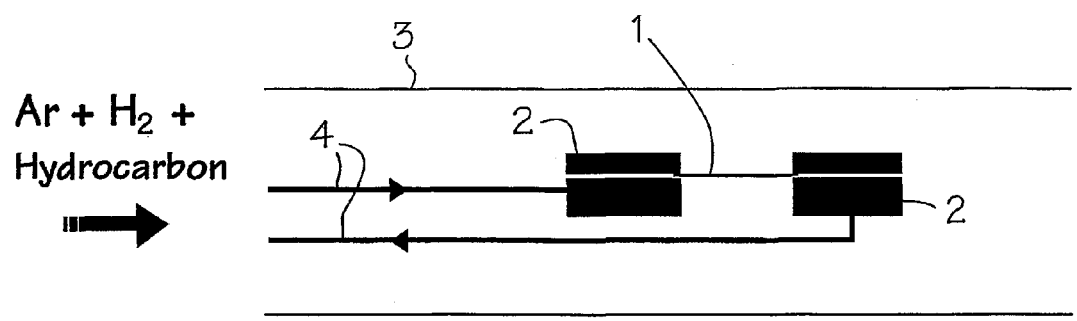
FIG. 1 is a schematic block diagram of an apparatus for carrying out the process of the invention.

The carbon paper 1 (FIG. 1) carrying the catalyst is placed between two graphite electrodes 2, mounted in a quartz tube 3. Stainless steel rods 4 connected to the electrodes 2 supply electrical power to the electrodes for heating the carbon paper 1 by the Joule effect. In this case, the power is 40 to 100 watts (5 to 8 amperes). A current of a few amperes is sufficient to raise the temperature of the carbon paper up to 1000° C. in less than 1 second. The carbon paper is thus heated in a first step to 200–600° C., preferably 400° C. in an argon atmosphere to decompose nitrates into oxide, which is then reduced to the metal form in an argon/hydrogen atmosphere. The iron catalyst is dispersed in the silicate. In order to obtain the carbon nanotubes, a mixture of 90% argon, 5% hydrogen and 5% of a hydrocarbon gas (acetylene or ethylene) is caused to flow over the paper for 15 minutes.

Carbon nanostructures were produced on the following metals: Fe Co, Ni, their binary alloys $Fe_{0.5}Co_{0.5}$, $Fe_{0.5}Ni_{0.5}$ and $Ni_{0.5}Co_{0.5}$, and their ternary alloy $Fe_{0.33}CO_{0.33}Ni_{0.33}$ The gases used include acetylene, ethylene, methane and CO at their optimum pyrolysis temperatures of 600 for acetylene and 700 for the other gases.

Figure 2:
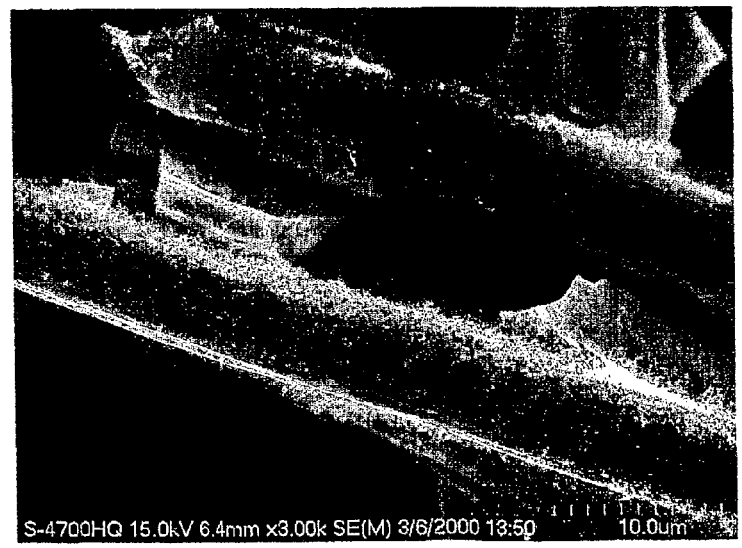
FIG. 2 is an electron micrograph of a typical area of nanotubes produced on a carbon paper substrate using the apparatus of FIG. 1.
Figure 3:
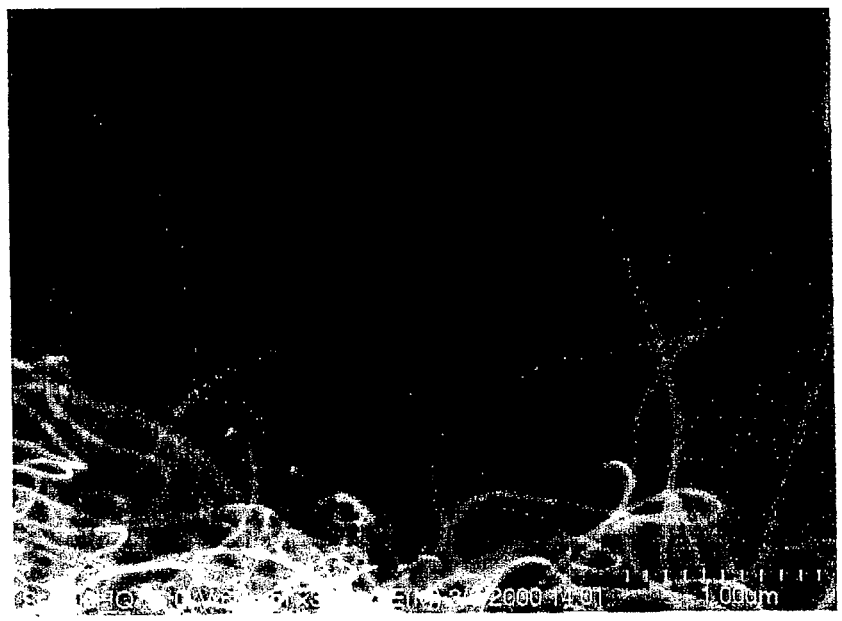
FIG. 3 is an electron micrograph of the free ends of nanotubes formed in the apparatus of FIG. 1.
Figure 4:
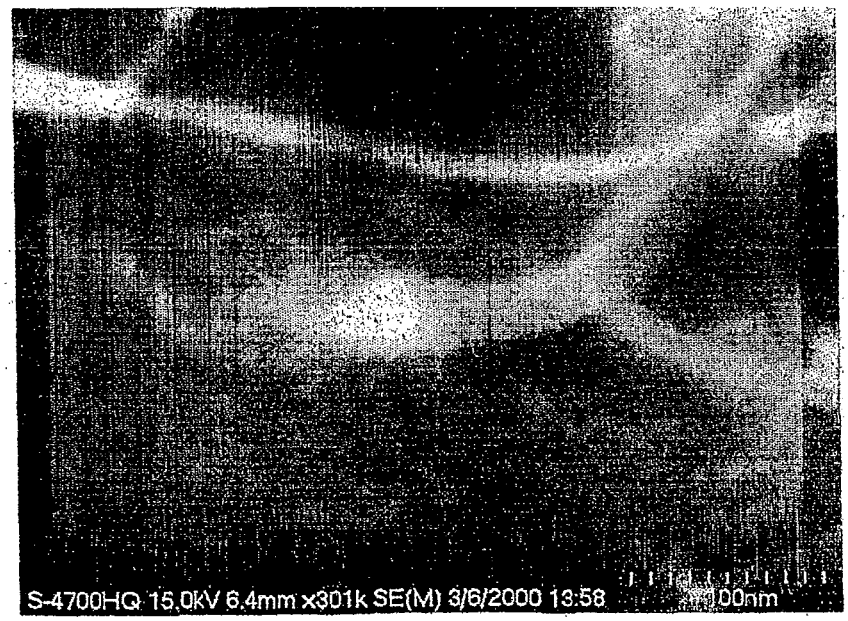
FIG. 4 is an electron micrograph of the bottom ends of nanotubes formed in the apparatus of FIG. 1.

The samples were analyzed using a transmission electron microscope (TEM) and a high resolution transmission electron microscope (HRTEM). FIG. 2 illustrates a typical area of nanotubes produced on the carbon paper 1. The carbon paper included carbon fibers with a diameter of 5 μm covered with the silicate. An excess of the silicate in the form of flakes is also present on the substrate. As shown in FIGS. 3 and 4, the nanotubes grow from a particle of metallic catalyst which is on the silicate. With the carbon paper substrate used, the contrast between the nanotubes (mainly transparent) and the metallic catalyst particles is easily seen by TEM. Thus, it has been found that the catalyst particles are found both at the base and at the tips of the nanotubes.

Figure 5:
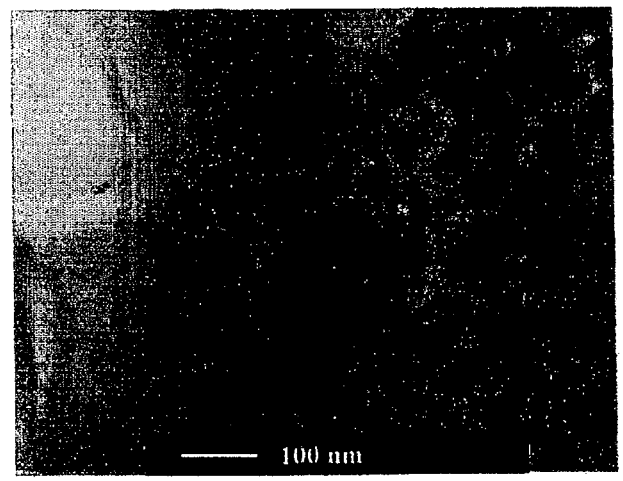
FIG. 5 is an electron micrograph of a silicate at the base of nanotubes of FIGS. 2 to 4.

It is readily apparent from FIG. 5 that there is no amorphous carbon on the substrate, in the silicate or on the nanotubes. The types of nanotubes (mostly multi-wall) produced are similar to those obtained by the conventional CVD method. The tubes have an external diameter of 5–25 nm, with 10–20 distinct layers when ethylene or acetylene is used as the carbon source. It has been observed that 15 minutes after the beginning of the synthesis process the nanotubes obtained had a length of 1–10 μm with ethylene and below 1 μm with acetylene. Iron at 700° C. is more reactive than at 600° C., and thus more readily decomposes the hydrocarbon to form longer tubes, i.e. the kinetics of nanotube formation is influenced more by temperature than by the type of gas used as the carbon source.

It is observed from FIG. 5 that iron particles with a diameter greater than 30 nm are entirely surrounded by graphite carbon, while catalyst particles having a diameter less than 25 nm lead to nanotube formation. Thus, it is concluded that only catalyst particles having a diameter less than 25 nm lead to the growth of nanotubes. Larger catalyst particles actively become surrounded by carbon. This observation leads to the conclusion that the main catalytic phenomena is a surface process and not a process occurring inside of the catalyst. The catalytic decomposition of the carbon source gas at the surface of the catalyst particles creates a reactive layer. The thickness of the gas layer depends on the quantity of gas and the reactivity of the catalyst particles. The reactivity is dependent upon the type of metal and the reaction temperature. The gas layer leads to the growth of nanotubes only if the force leading to growth are strong than the force retaining the gas at the surface of the catalyst particles.

Method 2

Figure 6:
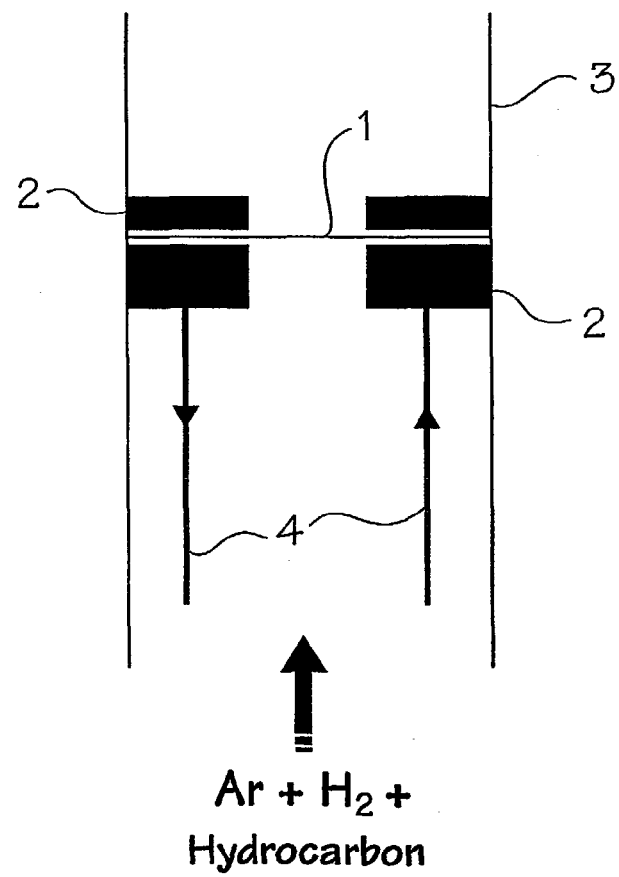
FIG. 6 is a schematic block diagram of a second embodiment of the apparatus for carrying out the process of the invention.

In a second process in accordance with the present invention, the catalyst, in the form of a suspension of fine metallic particles, is sprayed onto carbon paper 1 (FIG. 6).

The catalyst is produced by suspending ultrafine metal particles in a suitable solvent such as toluene by adding a surfactant. The metal catalyst particles are selected from the group consisting of Fe, $Fe_2O_3$, Ni, Co and alloys of Fe, Ni and Co having a particle size of 2 to 100 nm, ideally 2 to 5 nm. Suitable surfactants include (octylphenoxy) polyethoxy ethanol, N'-cyclohexyl-p-phenylenediamine and preferably dioctyl sulfosuccinate sodium salt. By using an ultrasonic bath, the suspension is made homogeneous. The resulting suspension is sprayed directly onto the carbon paper 1 using a conventional chromatography sprayer. For example, 1–20 mg of fine catalyst particles are added to 5 ml of toluene containing 1–20 mg of the surfactant, and the suspension is sprayed onto the carbon paper 1.

Figure 7:
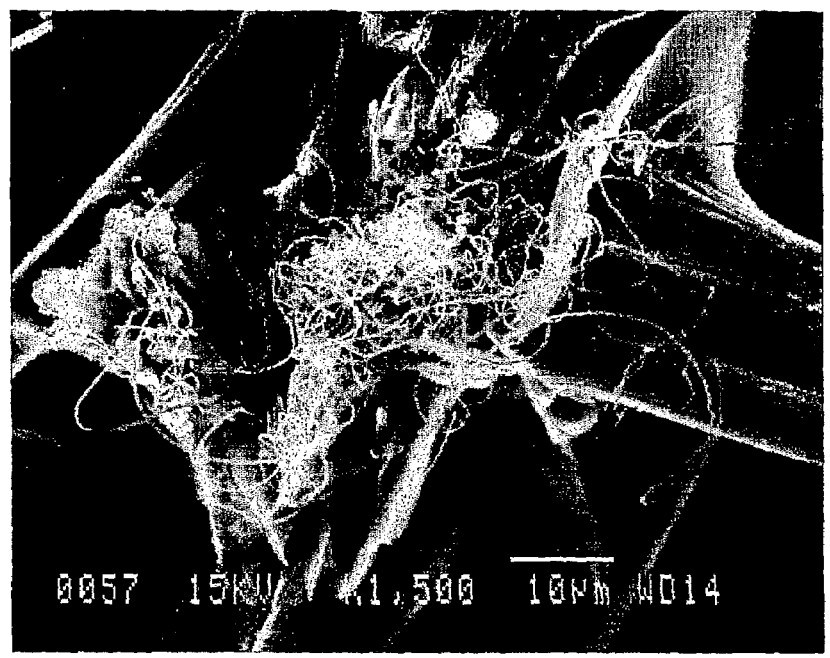
FIG. 7 is an electron micrograph of carbon nanotubes formed in the apparatus of FIG. 6.

The carbon paper 1 (FIG. 6) carrying the catalyst 1 is placed between two graphite electrodes 2 mounted in a quartz tube 3, and electrical power is supplied to the electrodes via stainless steel rods 4, as described in Method 1. The mixture of argon, hydrogen and hydrocarbon gas is fed into the tube 3 and through the carbon paper to produce nanotubes The samples were analyzed using a scanning electron microscope (SEM). FIG. 7 illustrates a typical area of nanotubes produced on the carbon paper 1. The nanotubes are seen mainly in the center of FIG. 7, the remainder of the figure showing larger carbon fibers from the carbon paper.

Method 3

In a third method fine catalyst particles are formed using a hollow cathode discharge apparatus, the principle of which is described in articles by K. Ishii in J. Vac. Sci Technol. A7(2), p 256–258, 1989 and by K. Ishii et al in J. Vac. Sci. Technol. A17(1), P 310–313, 1999.

Figure 8:
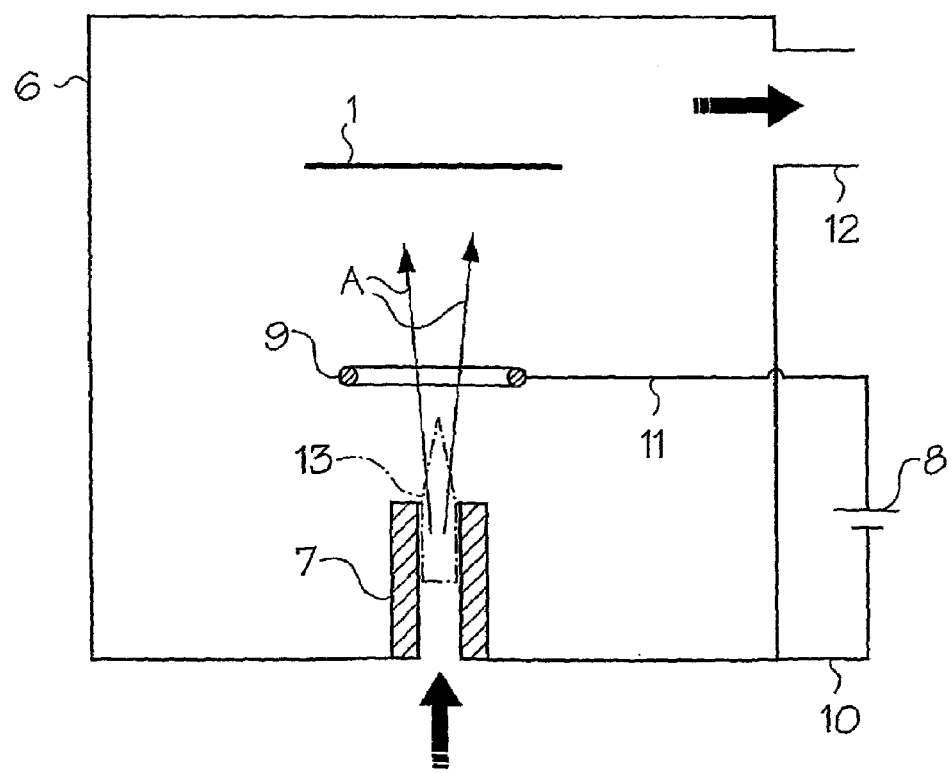
FIG. 8 is a schematic block diagram of another embodiment of the apparatus for carrying out the process of the invention.

Referring to FIG. 8, the hollow cathode apparatus includes a housing 6 containing a tubular metal cathode 7 in the bottom end thereof, which also serves as a gas inlet. The metal used in the cathode 7 is iron for producing a catalyst of fine iron particles. The cathode 7 can also be a molybdenum tube for producing a molybdenum catalyst, an iron tube with a shorter cobalt tube welded to the interior thereof for producing an iron/cobalt alloy, or an iron tube with shorter nickel and cobalt tubes welded therein, i.e. slid into the iron tube and welded thereto for producing an Fe/Ni/Co catalyst. Gas is discharged from the housing 6 via an outlet 12 and a pump (not shown).

In a first step, argon gas flows into the cathode 7 at a pressure of 0.2–1 torr and a flow rate of 100–500 $cm^3$/min. Electrical power (DC at 100 MA to 1 A and a voltage of approximately 400 volts) from a source 8 is supplied to the cathode 7 and an annular anode 9 via lines 10 and 11. A sputtering of small particles of metal catalyst (plasma 13) occurs in the discharge region of the cathode 7 within a few seconds of turning on the power. When the iron cathode contains Co or Co and Ni, metal ions in the plasma 13 combine to form alloys. The proportions of the metals in the alloy are dictated by the exposed area of the Co or Co and Ni tubes in the cathode 7. The metal ions flow through the anode 9 in the direction of arrows A and are deposited on carbon paper 1 mounted in the housing 6. The size of the catalyst particles is controlled by the current and voltage applied to the cathode 7, and by the pressure and rate of gas flow through the cathode 7. In a second step, power flow to the cathode 7 is discontinued, and a mixture of argon and a source of carbon is fed through the cathode 7 to the heated carbon paper with catalyst thereon.

Suitable carbon sources include carbon monoxide, methane, ethane and ethylene.

It is possible to produce the catalyst and fabricate nanotubes in a single operation by introducing a mixture of argon and a carbon source through the cathode simultaneously. However, a one-step method could result in the formation of amorphous carbon which is undesirable in the production of nanotubes.

Figure 9:
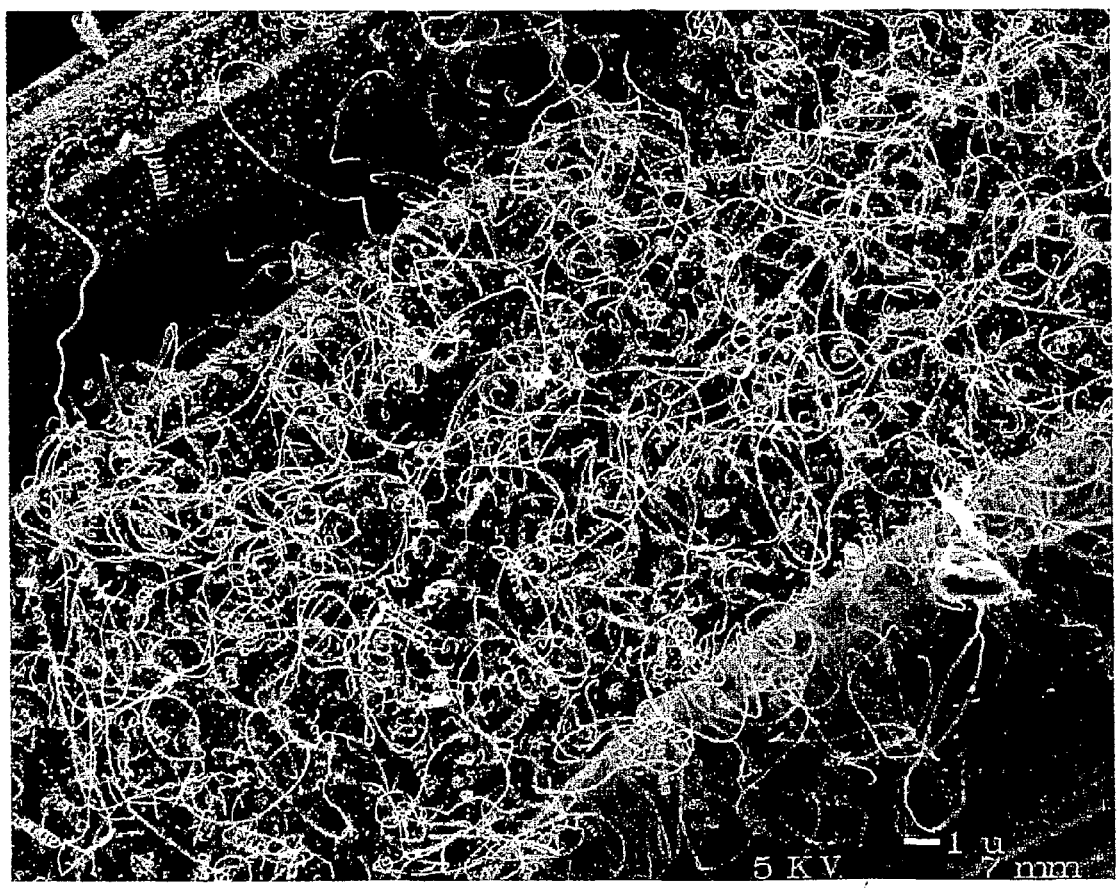
FIG. 9 is an electron micrograph of carbon nanotubes formed in the apparatus of FIG. 8.

When nickel was used as the hollow cathode, and CO as the carbon source in a two-stage process, the result was the nanotubes illustrated in FIG. 9.

Method 4

Figure 10:
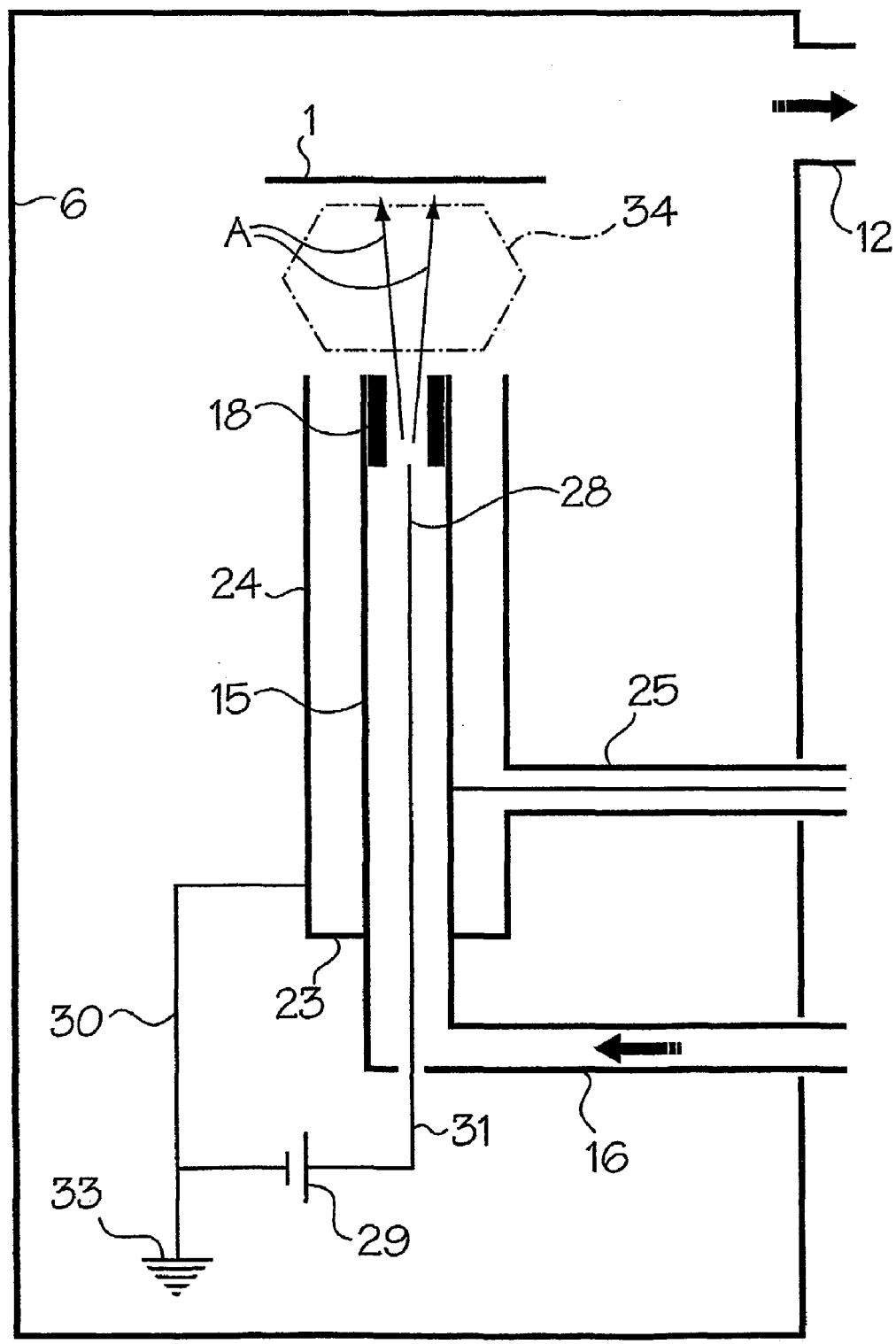
FIG. 10 is a schematic block diagram of another apparatus for carrying out the process of the invention.

With reference to FIG. 10, in a fourth method in accordance with the invention an auxiliary plasma is produced to prevent coalescing of catalyst particles as they are discharged from the cathode.

In the apparatus of FIG. 10, argon is introduced into the bottom end of a tube 15 via an inlet 16. The argon gas is discharged through a tubular cathode 18 in the open top end of the tube 15 producing plasma in an area beneath carbon paper 1. The tube 15 passes through the otherwise closed bottom end 23 of a second larger tube or housing 24. The tube 15 is connected to a microwave source (not shown) by a co-axial connector 25. Power is supplied to the cathode 18 and an anode 28 from a DC source 29 via leads 30 and 31. Lead 30 is grounded at 33, and is connected to the cathode 18 via the tubes 24 and 15.

In operation, argon is introduced into the tube 15 via the inlet 16 as described in Method 3. When power is supplied to the cathode 18, sputtering occurs to produce ultrafine catalyst particles, which are deposited on the carbon paper 1. The microwaves produced in the tube 15 create an auxiliary plasma 34 between the top end of the tube 15 and the carbon paper 1 which ensures the production of ultrafine particles of catalyst. The argon is introduced into the tube 15 at a flow rate of 100–500 $cm^3$/min and a pressure of 0.2–1 torr. The DC current to the cathode 18 is 100 mA to 1 A and the voltage is 400 volts.

As soon as the catalyst has been deposited on the carbon paper 1, carbon-containing gas is introduced into the tube 15 via the inlet 16 which results in the formation of nanotubes on the hot carbon paper. As in the case of Method 3, the nanotubes can be formed in a single step. In the one step method, argon under pressure is introduced into the tube 15 to produce catalyst particles which are deposited on the carbon paper 1. The carbon-containing gas is simultaneously introduced into the tube 15.

We claim:

1. A process for producing carbon nanotubes comprising the steps of:
   (a) depositing a metallic catalyst on a porous carbon substrate;
   (b) passing a feedstock gas containing a source of carbon through the substrate; and
   (c) applying an electrical current to said substrate to heat the substrate sufficiently to generate a reaction between said catalyst and said gas, resulting in the formation of carbon nanotubes.

2. The process of claim 1, wherein said substrate is carbon paper.

3. The process of claim 2, wherein said catalyst is selected from the group consisting of iron, nickel and cobalt.

4. The process of claim 3, wherein the source of carbon in said feedstock gas is selected from the group consisting of carbon monoxide, acetylene, ethylene and methane.

5. The process of claim 4, wherein feedstock gas includes hydrogen and an inert gas.

6. The process of claim 5, wherein said inert gas is argon.

7. A process for producing carbon nanotubes comprising the steps of:
   (a) passing an inert gas under pressure through a tubular metal cathode while passing an electric current through the cathode to produce a plasma of fine catalyst particles;
   (b) depositing the catalyst particles thus produced onto a porous carbon substrate proximate the cathode whereby the substrate is heated; and
   (c) passing a feedstock gas containing a source of carbon through the heated substrate to cause a reaction between the catalyst and the carbon source resulting in the formation of carbon nanotubes.

8. The process of claim 7, wherein the inert gas containing the catalyst and the feedstock gas are simultaneously passed through the cathode to form the nanotubes in one step.

9. The process of claim 7, wherein the inert gas containing the catalyst and the feedstock gas simultaneously impinge upon the carbon substrate to form the nanotubes in one step.

10. The process of claim 9, wherein the inert gas is argon and the feedstock gas is selected from the group consisting of methane, ethane, acetylene and carbon monoxide.

11. The process of claim 7, wherein the tubular cathode is formed of an element selected from the group consisting of iron, nickel and cobalt.

12. The process of claim 7, wherein the tubular cathode is iron and at least one of cobalt and nickel, whereby the catalyst produced by passing the inert gas through the cathode is an alloy.

13. The process of claim 7, including the step of producing an auxiliary plasma in said cathode to prevent coalescing of catalyst particles produced by passing said feedstock gas through said cathode.

14. An apparatus for producing carbon nanotubes comprising:
   (a) tube means defining a reaction chamber for receiving a hydrocarbon gas;
   (b) spaced apart electrode means in said tube means for together retaining a carbon substrate in said tube means; and
   (c) conductor means for supplying electrical power to said electrode means for heating said carbon substrate by the Joule effect, whereby, when the hydrocarbon gas is introduced into said reaction chamber and the carbon substrate is heated by introducing electrical power thereto, nanotubes are produced on said carbon substrate.

15. An apparatus for producing carbon nanotubes comprising:
   (a) a housing defining a reaction chamber for receiving a carbon substrate;
   (b) an inlet tube in said reaction chamber for introducing gas into said housing;
   (c) a catalytic metal cathode in said inlet tube;
   (d) an anode in said reaction chamber between and spaced apart from said cathode and a carbon substrate in said housing, whereby, when electric current is supplied to the anode and an inert gas is passed through said cathode under pressure, a primary plasma of fine metallic catalyst particles are produced and deposited on said carbon substrate, and, when a gas containing a source of carbon is passed through said inlet tube and impinges on said substrate, carbon nanotubes are formed.

16. The apparatus of claim 15, wherein said cathode defines the entire inlet tube.

17. The apparatus of claim 15, wherein said anode is coaxial with said cathode in said inlet tube.

18. The apparatus of claim 17, including a cable in said tube for connecting the tube to a source of microwave energy, whereby, when microwave energy is supplied to the cable and the inert gas is passed through the inlet tube, an auxiliary plasma is produced between said tube and the carbon substrate to prevent coalescing of catalyst particles.

* * * * *